(12) United States Patent
Banach et al.

(10) Patent No.: US 8,415,260 B2
(45) Date of Patent: Apr. 9, 2013

(54) CHIP IDENTIFICATION FOR ORGANIC LAMINATE PACKAGING AND METHODS OF MANUFACTURE

(75) Inventors: Albert J. Banach, Colchester, VT (US); Timothy H. Daubenspeck, Colchester, VT (US); Wolfgang Sauter, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 12/756,284

(22) Filed: Apr. 8, 2010

(65) Prior Publication Data

US 2011/0248412 A1 Oct. 13, 2011

(51) Int. Cl.
*H01L 21/00* (2006.01)
(52) U.S. Cl. .................... 438/800; 257/E23.179
(58) Field of Classification Search ............. 438/800, 438/462; 257/E23.179
See application file for complete search history.

(56) References Cited

U.S. PATENT DOCUMENTS

| | | | |
|---|---|---|---|
| 4,707,722 A | 11/1987 | Folk et al. | |
| 5,780,142 A * | 7/1998 | Kume et al. | 428/195.1 |
| 5,838,361 A | 11/1998 | Corbett | |
| 5,985,377 A | 11/1999 | Corbett | |
| 6,175,162 B1 | 1/2001 | Kao et al. | |
| 6,744,144 B2 | 6/2004 | Peterson | |
| 6,812,477 B2 * | 11/2004 | Matsunami | 250/548 |
| 7,198,879 B1 * | 4/2007 | Tredwell et al. | 430/200 |
| 7,265,454 B2 * | 9/2007 | Seddon et al. | 257/790 |
| 2003/0003688 A1 | 1/2003 | Tandy et al. | |
| 2005/0009298 A1 * | 1/2005 | Suzuki et al. | 438/459 |
| 2005/0017353 A1 | 1/2005 | Seddon et al. | |
| 2011/0133347 A1 * | 6/2011 | Huang et al. | 257/797 |
| 2011/0156033 A1 * | 6/2011 | Bintang et al. | 257/48 |

* cited by examiner

*Primary Examiner* — William D Coleman
(74) *Attorney, Agent, or Firm* — Anthony Canale; Roberts Mlotkowski Safran & Cole, P.C.

(57) ABSTRACT

A chip identification for organic laminate packaging and methods of manufacture is provided. The method includes forming a material on a wafer which comprises a plurality of chips. The method further includes modifying the material to provide a unique identification for each of the plurality of chips on the wafer. The organic laminate structure includes a chip with a device and a material placed on the chip which is modified to have a unique identification mark for the chip.

3 Claims, 7 Drawing Sheets

CHIP IDENTIFICATION FOR ORGANIC LAMINATE PACKAGING AND METHODS OF MANUFACTURE

FIELD OF THE INVENTION

The invention relates to semiconductor structures and methods of providing identification to a chip package and, more particularly, to chip identification for organic laminate packaging and methods of manufacture.

BACKGROUND

Chip identification is required in order to provide proper identification of chips that are, for example, manufactured using different manufacturing runs. Chip identification may also be important in order to easily identify chips that may be required for certain applications. For example, backside identification of chip packages is required in order to maintain order in routine production, and to recover from minor disruptions related to loss of normal order. For server products or other products using Temporary Chip Attach (TCA) and/or burn-in processing, chip labels are critical in assigning and maintaining separate populations of "good" and "bad" parts, and different speed sorts that may be required for different final modules. For example, for a population where normal order has been lost, without backside chip identification, TCA remount would be required to remove "bad" chips which, in turn, would negatively impact shipments and revenue.

By using backside identification, it is possible to identify and remove populations of parts from stock based on wafer/lot origin, in response to the identification of a maverick or "non-conforming" population. Also, as particular chips may be required for physical failure analysis (PFA), it may be necessary to identify such chips for analysis. In addition, identification of the chips is important in order to perform a resort when parts become mixed in stock or to identify "bad" chips during the resort. All of this can only be readily accomplished if wafer and chip identification are physically encoded into the package for an operator to read at an inspection station.

Figure 1:
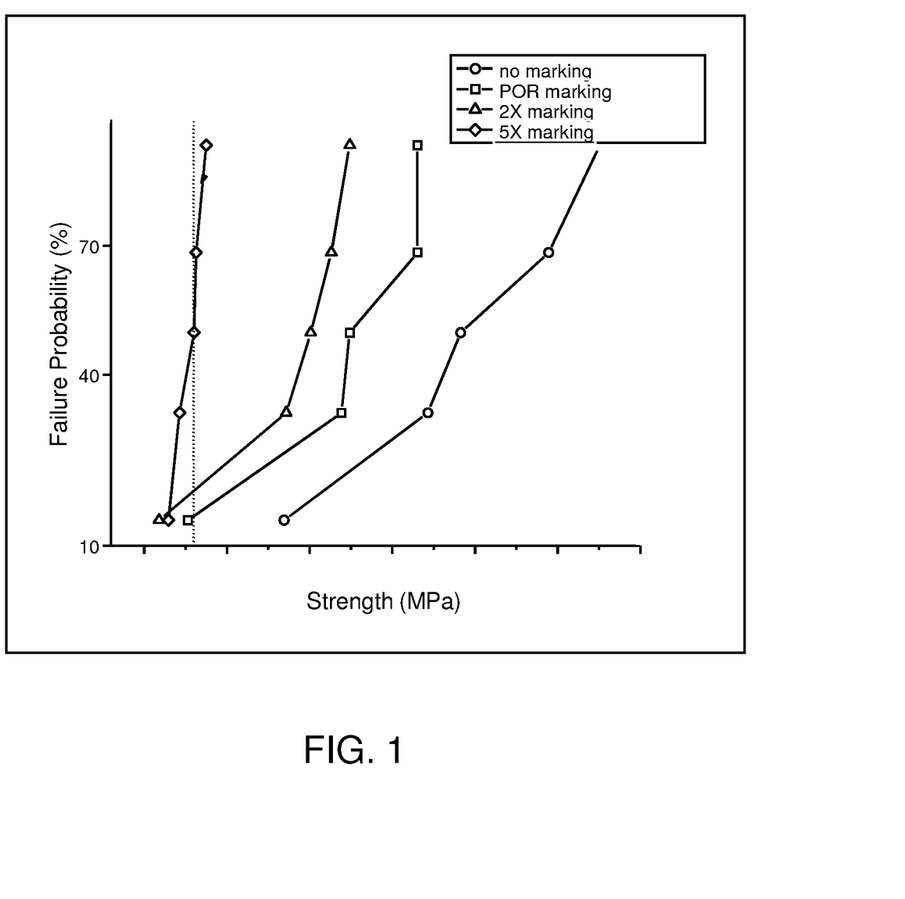
FIG. 1 shows a graph of breaking strength of Silicon chips for multiple laser scribe conditions.

Historically, for ceramic substrate parts, a laser backside chip scribe is employed to provide this information. This has worked well as the coefficient of thermal expansion (CTE) of the Silicon chip and the ceramic substrate are relatively close. For example, the CTE of a ceramic substrate is about 8-10 ppm/° C. and the CTE of the chip is about 3 ppm/° C. A larger CTE difference between chip and substrate, as is the case with chips assembled on organic substrates, will result in increased risk of chip breaking during assembly. On the other side, laser marking decreases the breaking strength of a chip. FIG. 1 shows the effect of laser marking on the breaking strength of Silicon chips.

With flip chip ball grid array (FCPBGA) organic laminate parts, a backside chip scribe has been shown to mechanically weaken the chip, such that it is more likely to fail under the influence of normal warpage stresses during thermal excursion. That is, the physical scribe on the backside of the chip provides a weakened area that can be a "break point" during warpage of the chip, which results from thermal expansions and contractions during normal manufacturing processes.

By more specific example, in organic chip technology, an organic substrate is attached to the chip by use of an epoxy underfill. The package is then subjected to a high temperature, e.g., about 150° C. for underfill cure. During cool down of the package, the organic substrate (i.e., laminate) shrinks more than the chip. This results in the backside of the chip being placed in tension. This is due to the differences in CTE between the chip and the organic laminate (e.g., CTE of the chip is about 3, whereas the CTE of the organic laminate is about 20). As a result of this tension, the chip has a tendency to fail at the scribe. As such, the chip backside scribe for organic laminates has been found to be unacceptable.

Accordingly, there exists a need in the art to overcome the deficiencies and limitations described hereinabove.

SUMMARY

In a first aspect of the invention, a method comprises forming a material on a wafer which comprises a plurality of chips. The method further comprises modifying the material to provide a unique identification for each of the plurality of chips on the wafer.

In another aspect of the invention, a method comprises depositing a material on a surface of a wafer. The method further comprises providing a unique identification for each of a plurality of chips that are formed on the wafer using the material. The unique identification does not weaken an underlying silicon layer on the wafer.

In yet another aspect of the invention, an organic laminate structure comprises a chip with a device and a material placed on the chip which is modified to have a unique identification mark for the chip.

In another aspect of the invention, there is a design structure tangibly embodied in a machine readable medium used for designing, manufacturing, or testing an integrated circuit. The design structure includes the method steps and/or structure of the present invention.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of providing identification to a chip package and, more particularly, to chip identification for organic laminate packaging and methods of manufacture. The present invention provides alternative backside marking methodologies that do not place the chip at risk for cracking by mechanically weakening the chip (as is the case of a typical backside scribe). More specifically, the present invention creates a physical, easily readable chip identification (ID) on the backside while minimally impacting mechanical chip strength for an organic laminate package. By way of example, the present invention contemplates (i) laser "fusing" or etching of a thin metal or other layer on a wafer backside; (ii) patterning features on the wafer backside; (iii) remote sensing of structures on the individual chip; (iv) patterning of BLM features; and/or (v) laser etching into PSPI (photosensitive polyimide) on the wafer front side. It should be understood by those of skill in the art that the methods described herein can be provided on the wafer, prior to dicing.

FIGS. 2a-2d show a process for marking an organic laminate package and resulting identification on the chip in accordance with aspects of the invention. In this process, the present invention contemplates the use of a laser fusing of a thin metal layer on a backside of the wafer to provide ID information unique to each chip. The identification process of FIGS. 2a-2d is used if there are concerns with dicing, for example.

Figure 2A:
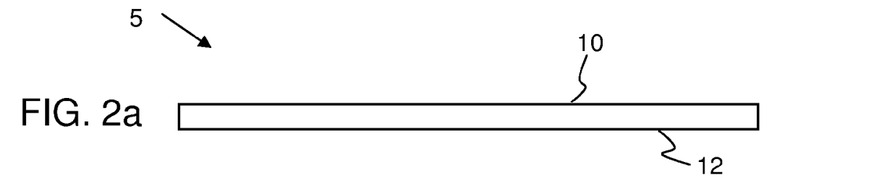
FIGS. 2a-2d show a process for marking an organic laminate package and resulting identification on the chip in accordance with aspects of the invention.
Figure 2B:
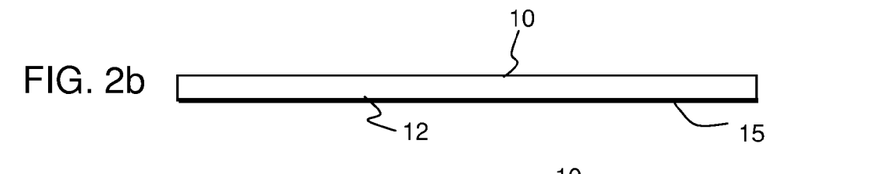

More specifically, FIG. 2a shows a device 5 with a front side (active side) 10 and a backside 12. The device 5 can be an active or passive device. For example, the device can be a device that amplifies an electrical signal (e.g. transistor, etc.) or a passive device such as, e.g., capacitors, inductors, MEMS, etc. As shown in FIG. 2b, a metal 15 is deposited on the backside 12 of the device. The metal 15 may be, for example, a refractory metal such as, for example, TaN, or Al, or a combination thereof. In embodiments, for the case of Al, the metal is deposited to a thickness of between about 0.5 to 1.5 microns using a conventional sputtering technique. It should be understood by those of skill in the art that the metal 15 may include an adhesion layer.

Figure 2C:
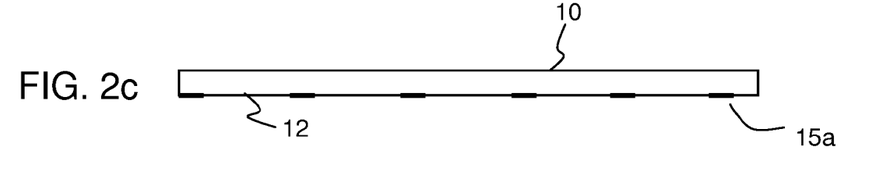

As shown in FIG. 2c, the metal 15 undergoes a conventional patterning process. In embodiments, the conventional patterning process can be a lithographic and etching (reactive ion etching (RIE)) process to form patterns 15a on the backside 12 (of the wafer). In embodiments, the patterns 15a are provided as smaller areas for reduced thermal impact.

Figure 2D:
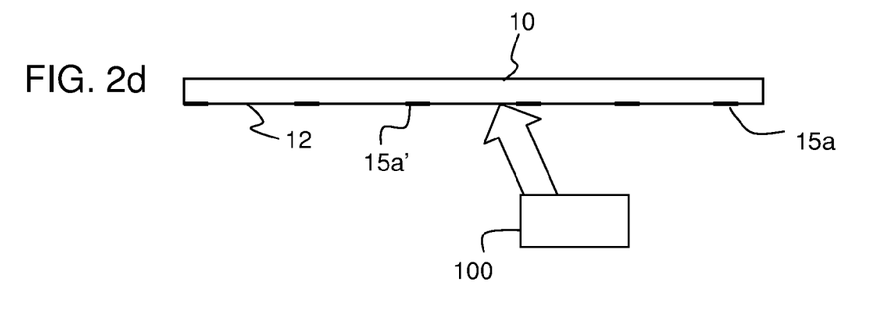

As shown in FIG. 2d, the metal patterns 15a undergo a laser scribing (etching or ablation) using a laser 100 to form identification marks 15a' on the patterns 15a. In this way, the metal patterns 15a act as a sacrificial writing block for the identification marks 15a'. In embodiments, the laser energy can range from about 5 W to 10 W, depending on the metal and depth of the metal used as the sacrificial writing block.

Figure 3A:
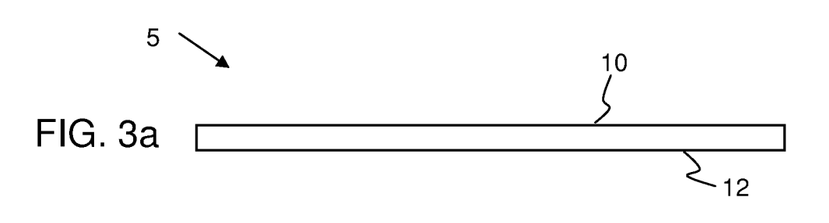
FIGS. 3a-3c show a process for marking an organic laminate package and resulting identification on the chip in accordance with aspects of the invention.
Figure 3B:
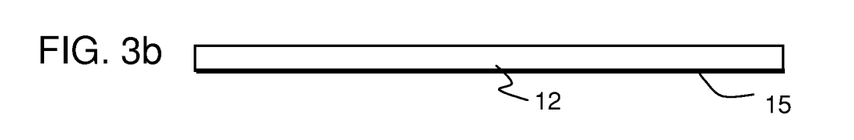
Figure 3C:
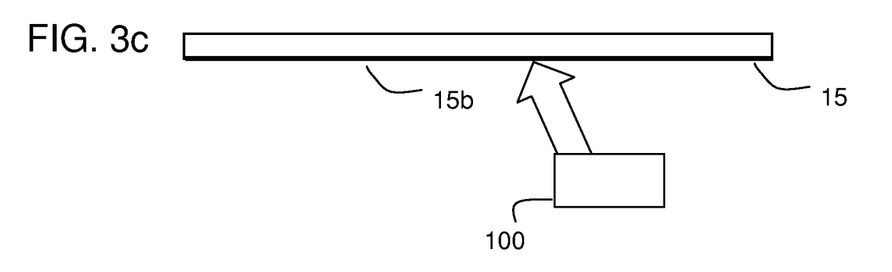

FIGS. 3a-3c show another process for marking an organic laminate package and resulting identification on the chip in accordance with another aspects of the invention. This process is similar to that of FIGS. 2a-2d, except that the metal 15 does not undergo an patterning process. The processes shown in FIGS. 3a-3c may be less expensive than that shown in FIGS. 2a-2d, as processes for patterning of the metal (e.g., lithographic and etching) are eliminated.

More specifically, FIG. 3a shows a device 5 with a front side (active side) 10 and a backside 12. The device 5 can be an active or passive device. For example, the device can be a device that amplifies an electrical signal (e.g. transistor, etc.) or a passive device such as, e.g., capacitors, inductors, MEMS, etc. As shown in FIG. 3b, a metal 15 is deposited on the backside 12 of the device. The metal 15 may be, for example, a refractory metal such as, for example, TaN, or Al, or a combination thereof. In embodiments, for the case of Al, the metal is deposited to a thickness of between about 0.5 to 1.5 microns using a conventional sputtering technique. It should be understood by those of skill in the art that the metal 15 may include an adhesion layer.

As shown in FIG. 3c, the metal 15 undergoes a laser scribing (etching or ablation) using a laser 100 to form identification marks 15b. In this way, the metal 15 acts as a sacrificial writing block for the identification marks 15b. In embodiments, the laser energy can range from about 5 W to 10 W, depending on the metal and depth of the metal used as the sacrificial writing block.

Table 1, below, shows experimental cells using the processes of the present invention. More specifically, Table 1 shows three cells. In the first cell, no metallization was provided on the chip (wafer), and a chip ID was scribed directly onto the Si layer of the backside of the wafer for each chip. In the second cell, an adhesion layer was used between the Si layer and the metal 15. The adhesion layer was, for example, TaN/Ti/TiN. The adhesion layer may be in the range of about 50 nm to about 100 nm. An aluminum layer was deposited on the adhesion layer to a depth of about 1.2 microns. A chip ID was then scribed into the metal. In the third cell, an adhesion layer was used comprising Ti/TiN. Again, this adhesion layer may be in the range of about 50 nm to about 100 nm. An aluminum layer was deposited on the adhesion layer to a depth of about 0.5 microns. A cap of, for example, TiN, was deposited on the metal layer. A chip ID was then scribed into the metal layer.

TABLE 1

Sribe Experiment with Aluminum Backside

| Cell | Aluminum Process | Liner | Aluminum Thickness | Cap | Wafer IDs | Picts |
|---|---|---|---|---|---|---|
| 1 | none | n/a | n/a | n/a | ARFXWEA AGFXNTA AXFXSAA | X |
| 2 | TD metal | TaN/Ti/TiN | 1.2 um | n/a | AEFXNVA ADFXNWA AUFXNFA | X |
| 3 | MZ metal | Ti/TiN | 0.5 um | TiN | AYFXVQA ANFXWHA ACFXNXA | X |

Figure 4:
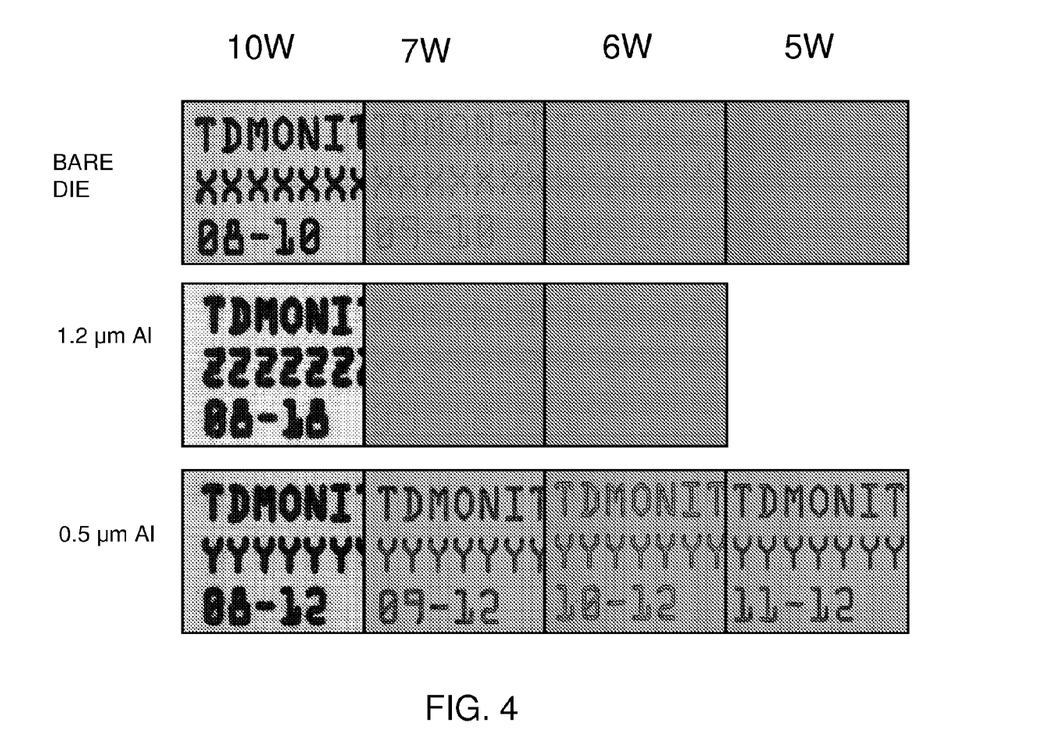
FIG. 4 shows a plurality results in accordance with aspects of the invention and in comparison to a bare Si die in accordance with aspects of the invention.

FIG. 4 shows results using the cell configurations described with reference to Table 1. More specifically, FIG. 4 shows the visual results of the three different cells as shown in Table 1. The results are provided for a laser energy of 10 W, 7 W, 6 W and 5 W. As clearly seen in FIG. 4, the configuration of cell 3 provided ideal results, as an ID was clearly visible with a laser energy of 5 W. That is, the use of 5 W provided a clear identification mark without the possibility of damaging and/or affecting and/or weakening (e.g., providing scribe marks) the underlying Si layer. Advantageously, this will ensure a stronger chip and hence less likelihood of cracking during thermal stressing. The results of cell 2 were also acceptable, as the use of 10 W on the metal provided a clear identification mark, which would not significantly affect and/or damage and/or weaken the underlying Si layer of the chip. On the other end of the spectrum, the use of 5 W and 6 W on the bare die did not provide any discernable identification mark, and the use of 10 W and 7 W on the base die damaged the backside of the wafer, which may result in a chip failure (weakened chip) during thermal stresses.

Figure 5A:
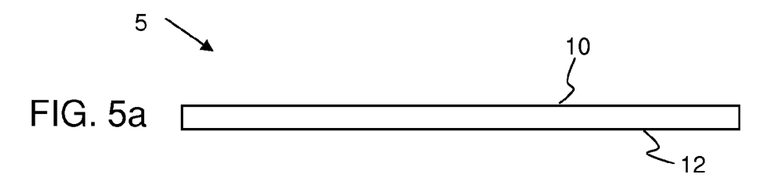
FIGS. 5a-5c show a process for marking an organic laminate package and resulting identification on the chip in accordance with aspects of the invention.
Figure 5B:
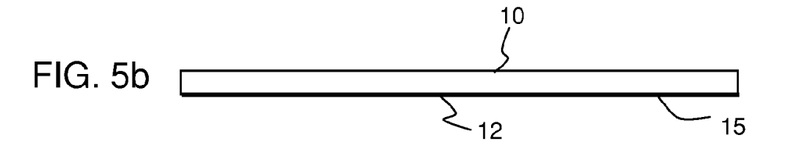
Figure 5C:
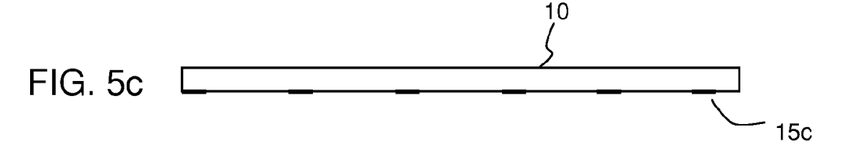

FIGS. 5a-5c show another process for marking an organic laminate package and resulting identification on the chip in accordance with aspects of the invention. In this process, the present invention contemplates the patterning of a thin layer on a backside of the wafer to provide unique chip identification.

More specifically, FIG. 5a shows a device 5 with a front side (active side) 10 and a backside 12. The device 5 can be an active or passive device. For example, the device can be a device that amplifies an electrical signal (e.g. transistor, etc.) or a passive device such as, e.g., capacitors, inductors, MEMS, etc. As shown in FIG. 5b, a metal or PSPI 15 is deposited on the backside 12 of the device. The metal 15 may be, for example, a refractory metal such as, for example, TaN, or Al. In embodiments, the metal or PSPI 15 is deposited to a thickness of between about 0.5 to 1.5 microns using conventional deposition techniques. It should understood by those of skill in the art that the metal 15 may include an adhesion layer.

As shown in FIG. 5c, the metal or PSPI 15 undergoes a conventional patterning process. In embodiments, the conventional patterning process can be a lithographic and etching (reactive ion etching (RIE)) process to form patterns 15c on the backside 12. The patterns 15c are unique to each chip on the wafer. In embodiments, the patterns 15c are fabricated using a wafer mask designed to have different patterns for each chip, as in other embodiments which require patterning. In this process, a laser is not required to scribe the chip identification.

Figure 6:
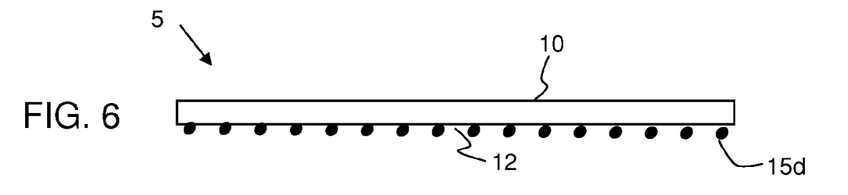
FIG. 6 shows a process for marking an organic laminate package and resulting identification on the chip in accordance with aspects of the invention.

FIG. 6 shows another process for marking an organic laminate package and resulting identification on the chip in accordance with aspects of the invention. More specifically, the device 5 of FIG. 6 uses ball limiting metallurgy (BLM) patterns 15d to identify the chips. In this embodiment, for example, BLM can be deposited using conventional C4 processes. For example, in embodiments, a wafer mask and conventional electroplating techniques are used to create different patterns/arrangements of C4 for each chip. These unique patterns/arrangements can then be used as an ID for each chip.

FIGS. 7a-7d show another process for marking an organic laminate package and resulting identification on the chip in accordance with aspects of the invention. The processes shown in FIGS. 7a-7d use a laser to directly write chip ID information into a polyimide film (PSPI) on each chip, on a wafer front side. Alternatively, the PSPI can be patterned to provide a unique ID for each chip.

Figure 7A:
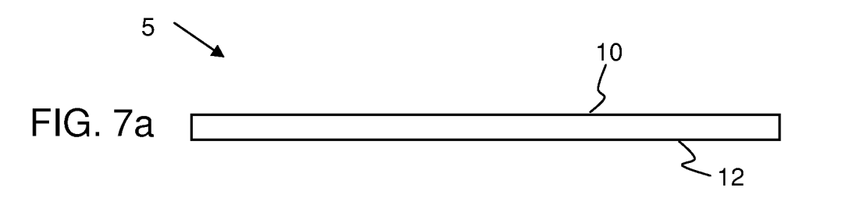
FIGS. 7a-7d show a process for marking an organic laminate package and resulting identification on the chip in accordance with aspects of the invention.
Figure 7B:
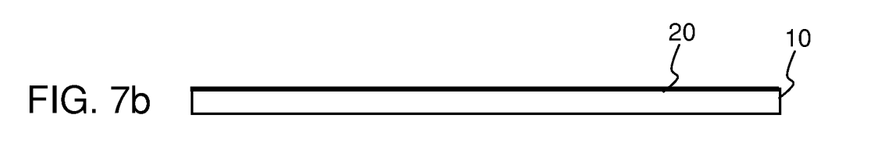

More specifically, FIG. 7a shows a device 5 with a front side (active side) 10 and a backside 12. The device 5 can be an active or passive device. For example, the device can be a device that amplifies an electrical signal (e.g. transistor, etc.) or a passive device such as, e.g., capacitors, inductors, MEMS, etc. As shown in FIG. 7b, a PSPI 20 is deposited on the front side 12 of the device. In embodiments, the PSPI 20 can range in thickness such as, for example, between about 0.5 to 5 microns, and can be deposited using conventional deposition techniques such as, for example, spin-on deposition. Advantageously, the PSPI 20 is already provided on the front side 10 of the device during conventional processing.

Figure 7C:
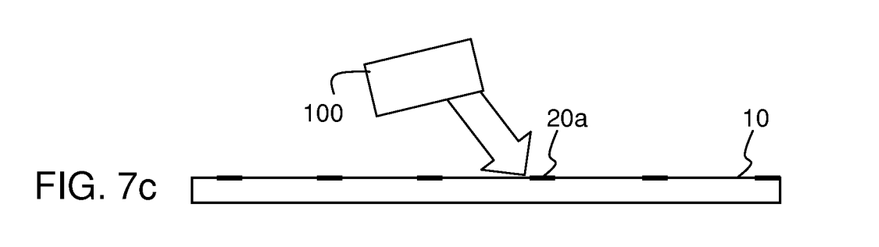

As shown in FIG. 7c, the PSPI 20 undergoes a conventional patterning process. In embodiments, the conventional patterning process can be performed using a lithographic and etching (reactive ion etching (RIB)) process to form patterns 20 on the front side 10. The patterns 20 can be unique to each chip on the wafer and, as such, provide a unique chip ID. In this process, a laser is not required to scribe the ID.

In an alternative process, a laser 100 can be used to etch ID information directly on the patterns 20. In still other alternative processes, a laser can be used to etch ID information directly on the PSPI, without the need to undergo a patterning process. In this process, the laser can be used to etch ID information directly on the PSPI for each chip. The energy level of the laser can be, for example, 10 W and below.

Figure 7D:
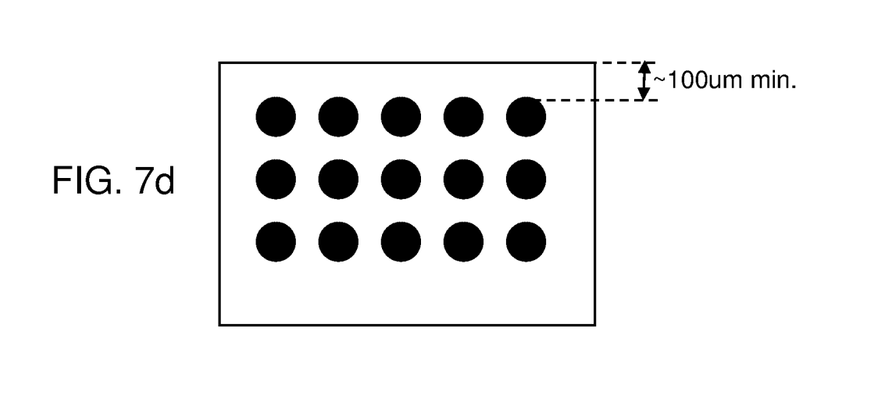

As shown in FIG. 7d, the laser can scribe into the PSPI layer at an edge of the wafer. For example, it is contemplated by the present invention to write an ID within an approximate 100 μM edge field (which is not utilized by current processes) of the chip with a 10 μM spot size; although other spot sizes are also contemplated by the invention.

In embodiments, it is possible to identify the chip using remote sensing options such as, for example, X-ray, microscopy and sonoscan technologies (e.g., non-invasive measures). Advantageously, chips can be identified in their trays using X-ray technologies. The X-ray technology can be used, for example, with the embodiment shown in FIG. 6. In this scenario, the X-ray can detect the arrangement of the C4 or BLM. In embodiments, the X-ray and/or sonoscan can also be used to determine other distinguishing features such as, for example, custom air gaps on each chip (which may be represented by reference numeral 22 in FIG. 7c).

Figure 8:
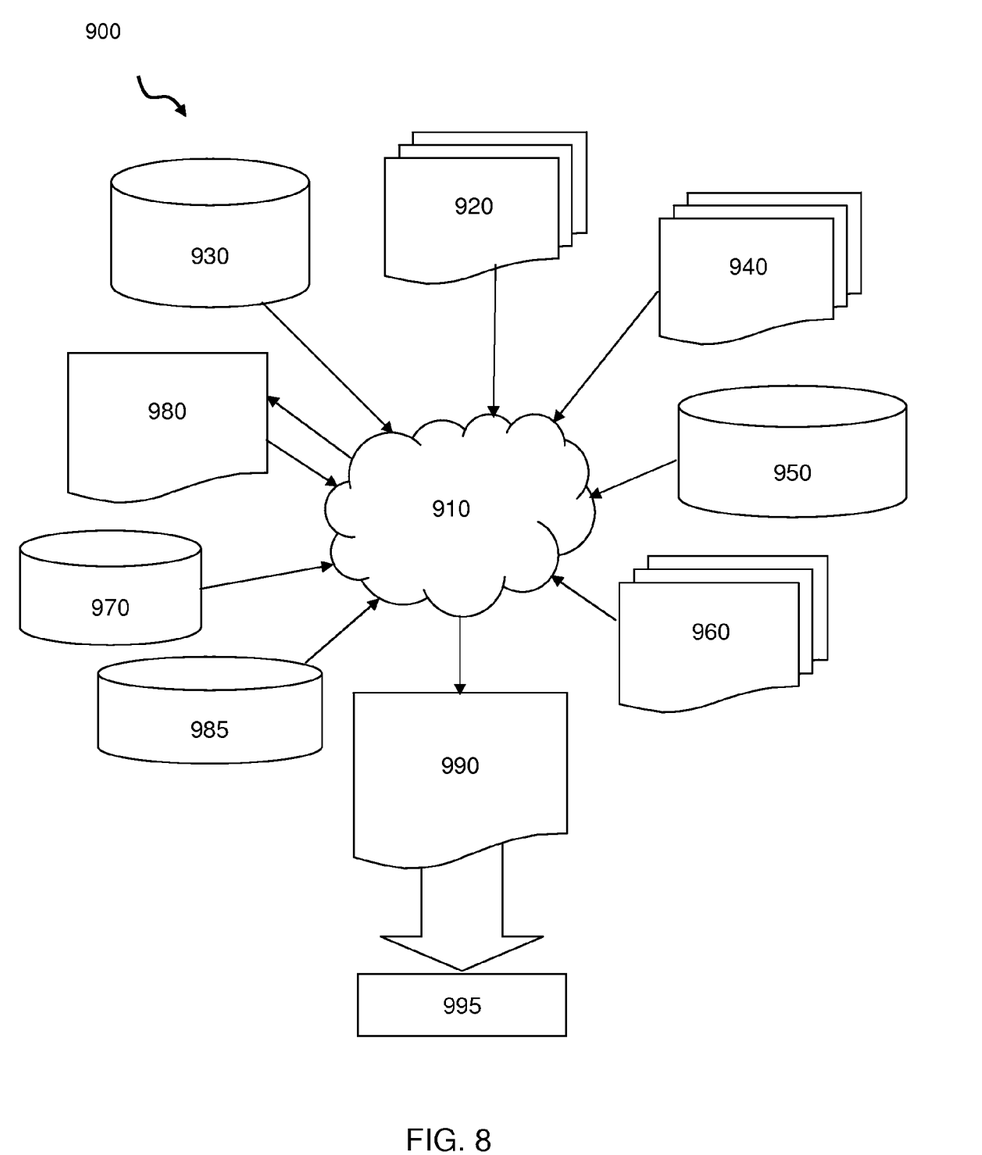
FIG. 8 is a flow diagram of a design process used in semiconductor design, manufacture, and/or test.

FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2a-7d, for example. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2a-7d, for example. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2a-7d, for example, to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2a-7d, for example. In one embodiment, design structure 990 may comprise a compiled, executable HDL simulation model that functionally simulates the devices shown in FIGS. 2a-7d, for example.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2a-7d, for example. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, where applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:
1. A method comprising:
   forming a material on a wafer which comprises a plurality of chips; and
   modifying the material to provide a unique identification for each of the plurality of chips on the wafer, wherein,
   the material is formed on a backside of the wafer,
   the modifying comprises scribing unique identification marks on each of the plurality of chips on the wafer using a laser,
   the material is metal and the laser has an energy that will not damage an underlying silicon layer on the wafer underside, and
   the metal includes an adhesion layer and a cap layer and the energy level ranges from about 10 W to about 5 W.
2. A method comprising:
   forming a material on a wafer which comprises a plurality of chips;
   modifying the material to provide a unique identification for each of the plurality of chips on the wafer, wherein the material is a ball limiting metallurgy (BLM) and the modifying includes arranging the BLM so that patterns are formed which are unique to each of the plurality of chips on the wafer.
3. A method comprising:
   depositing a material on a surface of a wafer; and
   providing a unique identification for each of a plurality of chips that are formed on the wafer using the material, the unique identification does not weaken an underlying silicon layer on the wafer, wherein the material is a ball limiting metallurgy (BLM) that is arranged on a backside to form the unique identification.

* * * * *